United States Patent
Saito

(10) Patent No.: US 6,387,295 B1
(45) Date of Patent: May 14, 2002

(54) ALKALI METAL-CONTAINING NIOBATE-BASED PIEZOELECTRIC MATERIAL COMPOSITION AND A METHOD FOR PRODUCING THE SAME

(75) Inventor: Yasuyoshi Saito, Aichi-ken (JP)

(73) Assignee: Kabushiki Kaisha Toyota Chuo Kenkyusho, Aichi-gun (JP)

(*) Notice: Subject to any disclaimer, the term of this patent is extended or adjusted under 35 U.S.C. 154(b) by 0 days.

(21) Appl. No.: 09/511,316

(22) Filed: Feb. 23, 2000

(30) Foreign Application Priority Data

Feb. 24, 1999 (JP) ............................ 11-045856
Feb. 21, 2000 (JP) ........................... 2000-042095

(51) Int. Cl.$^7$ .............................................. H01L 41/18
(52) U.S. Cl. ................... 252/62.9 R; 501/134; 264/614; 264/431; 264/432; 264/436; 264/442; 264/489; 264/491; 264/492
(58) Field of Search ..................... 252/62.9 R; 501/134; 264/431, 432, 436, 442, 489, 491, 492, 614

(56) References Cited

U.S. PATENT DOCUMENTS 5,476,720 A * 12/1995 Günter et al. ............... 428/471
5,562,768 A    10/1996 Ouwerkerk ................... 117/78
5,614,129 A *  3/1997 Hofmeister et al. ......... 252/584

FOREIGN PATENT DOCUMENTS

| JP | 50-47193 | 4/1975 |
|---|---|---|
| JP | 60-52098 | 11/1985 |
| JP | 1-032186 | 6/1989 |
| JP | 3-40000 | 6/1991 |
| JP | 7-82024 | 3/1995 |
| JP | 9-165262 | 6/1997 |

OTHER PUBLICATIONS

Patent Abstracts of Japan, vol. 004, No. 087 (E–016), Jun. 21, 1980, JP 55 055589, Apr. 23, 1980.
R.M. Henson, et al., Journal of the American Ceramic Society, vol. 60, No. 1–2, pp. 15 to 17, "Dielectric and Electromechanical Properties of (Li, Na) NbO$_3$ Ceramics", Jan. 1997.
R. Hofmeister et al., Journal of Crystal Growth, vol. 131, No. 3–4, pp. 486–494, "Growth and Characterization of the Perovskite $K_{1-y}Li_yTa_{1-x}Nb_xO_3$: Cu", Aug. 1993.
Abstract for JP 55–55589, Apr. 23, 1980.*
Hanson et al, "Dielectric and Electromechanical Propties of (Li,Na)NbO3 Ceramics", Journ. Amer. Cer. Soc., vol. 60, No. 1–2, Jan. 1997, pp. 15–17.*
Hofmeister et al, "Groath and Characterization of The Perovskite K(1–y)LiYTa(1–x)NbxO3:Cu", Journ. Crystl. Growth, vol. 131, No. 3–4, 8/93, pp. 486–894.*

* cited by examiner

*Primary Examiner*—C. Melissa Koslow
(74) *Attorney, Agent, or Firm*—Oblon, Spivak, McClelland, Maier & Neustadt, P.C.

(57) ABSTRACT

An alkali metal-containing niobate-based piezoelectric material composition comprises a solid solution represented by a composition formula (ANbO$_3$) (A: alkali metal), and at least one additive selected from Cu, Li and Ta.

9 Claims, 10 Drawing Sheets

KNN : $K_{0.5}Na_{0.5}NbO_3$
KNN –CuO: $K_{0.5}Na_{0.5}NbO_3$

KNN : $K_{0.5}Na_{0.5}NbO_3$

KNN-CuO: $K_{0.5}Na_{0.5}NbO_3$

KNN : $K_{0.5}Na_{0.5}NbO_3$

KNN-CuO : $K_{0.5}Na_{0.5}NbO_3$ + 1 mol% CuO

KNN : $K_{0.5}Na_{0.5}NbO_3$

KNN-CuO : $K_{0.5}Na_{0.5}NbO_3$ + 1 mol% CuO

KNN : $K_{0.5}Na_{0.5}NbO_3$

KNN-LT: $\{(K_{0.5}Na_{0.5})_{0.9}Li_{0.1}\}(Nb_{0.8}Ta_{0.2})O_3$

KNN : $K_{0.5}Na_{0.5}NbO_3$
KNN-LT : $\{(K_{0.5}Na_{0.5})_{0.9}Li_{0.1}\}(Nb_{0.8}Ta_{0.2})O_3$

KNN : $K_{0.5}Na_{0.5}NbO_3$

KNN-LT : $[(K_{0.5}Na_{0.5})_{0.9}Li_{0.1}](Nb_{0.8}Ta_{0.2})O_3$

KNN : $(K_{0.5}Na_{0.5})NbO_3$

KNN-LT : $[(K_{0.5}Na_{0.5})_{0.9}Li_{0.1}](Nb_{0.8}Ta_{0.2})O_3$

Electromechanical coupling factors (kp)

| Li (mol%) \ Ta (mol%) | 0 | 10 | 20 | 30 | 40 |
|---|---|---|---|---|---|
| 20 | 0.092 | 0.170 | 0.187 | 0.150 | 0.160 |
| 15 | 0.087 | 0.203 | 0.230 | 0.209 | 0.204 |
| 10 | 0.151 | 0.292 | 0.307 | 0.292 | 0.283 |
| 8 | 0.196 | 0.340 | 0.335 | 0.313 | 0.287 |
| 6 | 0.332 | 0.415 | 0.383 | 0.406 | 0.336 |
| 4 | 0.371 | 0.456 | 0.501 | 0.431 | 0.382 |
| 2 | 0.469 | 0.395 | 0.341 | 0.380 | 0.330 |
| 0 | 0.334 | 0.453 | 0.465 | 0.332 | 0.294 |

Piezoelectric constant ($d_{31}$ pm/V)

| Li (mol%) \ Ta (mol%) | 0 | 10 | 20 | 30 | 40 |
|---|---|---|---|---|---|
| 20 | 9.7 | 20.2 | 21.5 | 16.4 | 17.3 |
| 15 | 10.1 | 23.2 | 25.1 | 23.7 | 22.0 |
| 10 | 20.4 | 39.6 | 36.3 | 32.5 | 33.2 |
| 8 | 27.5 | 50.8 | 46.1 | 41.2 | 35.6 |
| 6 | 57.7 | 71.0 | 60.1 | 58.3 | 46.3 |
| 4 | 39.8 | 69.5 | 95.0 | 73.1 | 63.5 |
| 2 | 46.9 | 51.4 | 54.3 | 79.3 | 70.1 |
| 0 | 37.6 | 49.5 | 60.5 | 62.9 | 66.0 |

Piezoelectric constant ($g_{31}$ $10^{-3}$ Vm/N)

| Li (mol%) \ Ta (mol%) | 0 | 10 | 20 | 30 | 40 |
|---|---|---|---|---|---|
| 20 | 2.8 | 4.2 | 4.5 | 3.7 | 3.6 |
| 15 | 2.2 | 4.8 | 5.4 | 4.6 | 4.6 |
| 10 | 3.5 | 6.7 | 6.6 | 6.6 | 6.3 |
| 8 | 4.7 | 6.8 | 6.8 | 6.1 | 6.4 |
| 6 | 7.5 | 7.9 | 7.1 | 7.7 | 6.0 |
| 4 | 11.0 | 10.3 | 9.0 | 7.5 | 6.2 |
| 2 | 14.5 | 9.3 | 6.8 | 6.1 | 4.7 |
| 0 | 9.9 | 12.1 | 10.5 | 6.0 | 4.1 |

Curie point (°C)

Dielectric constant (E33t)

Dielectric loss (tan δ)

ALKALI METAL-CONTAINING NIOBATE-BASED PIEZOELECTRIC MATERIAL COMPOSITION AND A METHOD FOR PRODUCING THE SAME

BACKGROUND OF THE INVENTION

1. Field of the Invention

The present invention relates to a niobate-based piezoelectric material composition and a method for producing the same; more specifically, the invention relates to an alkali metal-containing niobate-based piezoelectric material composition for use in the knocking sensor of automobile engine and the like.

2. Description of Related Art

Piezoelectric materials have been used conventionally for the knocking sensor of an automobile engine. Piezoelectric materials are broadly divided as piezoelectric materials containing lead-based substances and piezoelectric materials not containing lead-based substance. These are selected and used, depending on the use. As known, lead is a hazardous substance. Hence, piezoelectric materials containing lead-based substances essentially contain the hazardous substances. Therefore, caution should be paid during the handling and use thereof. Thus, piezoelectric materials of excellent characteristic properties but with no content of hazardous substances such as lead-based substances are demanded.

The piezoelectric materials with no content of lead-based substances are known, which are produced for example by adding various auxiliary components to niobate-based materials ($ANbO_3$); e.g., A: alkali metal, thereby elevating the sinterability of the materials to highly densify the materials and thereby raise the stability thereof over time. When the sinterability is enhanced in such a manner, the components and phases of the materials can be densified to final high densities. Hence, the resulting piezoelectric constants electromechanical coupling factors and mechanical quality factors thereof are relatively high. Additionally, piezoelectric materials are of great safety performance because of no content of hazardous substance, and with great piezoelectric properties and high stability.

As auxiliary components to be added to such niobate-based materials, use is made of various materials. For example, Japanese Patent Laid-open No. Sho 50(1975)-47193 discloses a composition composed of a composition formula $KNbO_3$-$NaNbO_3$-$LiNbO_3$ with addition of manganese oxide; additionally, Japanese Patent Publication No. Sho 60 (1985) -52098 discloses a composition composed of a general formula $Na_{1-x}Li_xNbO_3$ ($0.02 \leq x \leq 0.30$) with addition of aluminum oxide within a range of 0.02 to 2.0% by weight and iron oxide within a range of 0.001 to 0.019% by weight. These are both intended to promote the sinterability of a material and thereby highly raise the relative density, thereby improving the electromechanical coupling factor to recover a material with large mechanical strength.

However, the niobate-based piezoelectric materials are so poor in terms of material sinterability and temperature properties including temperature stability at high temperature and stability over time, that the material properties are deteriorated, depending on the time elapsed in day, although the niobate-based piezoelectric materials have excellent properties at first. Thus, the niobate-based piezoelectric materials are prepared by molding above the re-crystallization temperature and pressing (by the hot press method). Compared with a so-called sintering method comprising molding a material at atmospheric pressure and then sintering the material, a sintered material at a high density can thereby be prepared at low temperature. However, the method is disadvantageous in that the production cost by the method is high and the method can never produce a larger sintered material. Thus, the material prepared by the hot press method has improved sinterability and is thus highly densified owing to the action of the auxiliary component therein. But the temperature stability and stability over time thereof are not satisfactory; and additionally, the production cost is disadvantageously high.

SUMMARY OF THE INVENTION

The present invention has been made in view of the above circumstances and has an object to overcome the above problems and to provide an alkali metal-containing niobate-based piezoelectric material composition by which a substitutional solid solubilization agent so as to improve the temperature property and stability over time of niobate-piezoelectric materials not containing lead-based materials can be found.

Another object of the present invention is to provide a niobate-based piezoelectric material composition which can be prepared by the existing sintering method at atmospheric pressure, as a preparation method thereof; and to provide a method for producing a niobate-based piezoelectric material composition which utilize the existing sintering method at atmospheric pressure.

Additional objects and advantages of the invention will set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the present invention, as embodied and broadly described herein, there is provided an alkali metal-containing niobate-based piezoelectric material composition comprising: a solid solution represented by a composition formula ($ANbO_3$) (A: alkali metal); and at least one additive selected from Cu, Li and Ta.

Preferably, the solid solution may be represented by a composition formula ($K_{1-x}Na_xNbO3$) (wherein x=0 to 0.8). In this case, the at least one additive may preferably be Cu having an amount of 0.001 to 5 mol %.

Alternatively, the solid solution may preferably be represented by a composition formula $Li_x(K_{1-y}Na_y)_{1-x}(Nb_{1-z}Ta_z)O_3$ (wherein x=0.001 to 0.2, y=0 to 0.8, z=0 to 0.4). In this case, the at least one additive may preferably be Cu, Li and Ta, each of them having an amount of not more than 5 mol %; or alternatively the at least one additive may preferably be Cu, Li and Ta, the Cu being in an amount of 0.001 to 5 mol %.

In such a manner, a material with good properties can be recovered because Cu acts as a sintering auxiliary agent for solid solution so that the relative density can be improved. Furthermore because Cu acts on the domain in the solid solution with an effect on the stabilization of the domain, the stability over time can be improved. Thus, a piezoelectric material with such a good property as described above can be provided. When the amount of Cu to be added then is below 0.001 mol %, Cu cannot function as a sintering auxiliary agent; while Cu is added above 5.0 mol %, the resulting properties are poor, disadvantageously. Thus, the optimum amount occupies 0.001 to 5.0 mol %.

Furthermore, the reason why Li and Ta are added is as following. Li acts as a sintering auxiliary agent because Li is sintered in the liquid phase during sintering; Ta acts on the ferroelectric domain in the solid solution to fix the ferroelectric domain and stabilize the dielectric loss. Through these actions, a piezoelectric material with great properties can be provided. As to the amount of Li then, an amount below 0.1 mol % or above 20 mol % is disadvantageous in that the resulting piezoelectric properties are deteriorated. Accordingly, the optimum amount occupies 0.1 to 20 mol %.

According to the present invention, the action of the additive (e.g., an additive powder containing Cu) as a sintering auxiliary agent can highly densify the material. Still furthermore, the action of the additive (e.g., an additive powder containing Cu) for substitutional solid solubilization can prevent the reduction of dielectric loss, so that excellent piezoelectric properties with good stability over time can be recovered. Because the material cannot contain any lead-based material, a material with great safety and high piezoelectric performance can be produced.

According to the present invention, the Li functions as a sintering auxiliary agent for promoting the high densification of the material and the Ta acts on the ferroelectric domain of a solid solution to reduce the dielectric loss and improve the dielectric constant, with the resultant recovery of a material with great stability over time and temperature stability. Because the resulting material does not contain any lead-based material either, the material can be used for a wide variety of use.

This invention also provides a method for producing an alkali metal-containing niobate-based piezoelectric material composition comprising: adding an additive powder containing at least one element selected from Cu, Li and Ta to a mixture powder represented by a composition formula $ANbO_3$ (A: alkali metal), then blending these powders together; molding said mixture powders and sintering the same; and giving piezoelectricity to the resulting sintered-substance in a process of a polarization treatment.

Preferably, the sintering process may be an atmospheric pressure sintering method or a mechanically pressed sintering method. In this case, the sintering process may preferably be carried out with a heating method selected from a group consisting of electric furnace heating, microwave heating, high frequency induction heating, and infrared heating.

Furthermore, the additive powder may preferably be 0.001 to 5 mol % of Cu, and the mixture powder may preferably be $K_{1-x}Na_xNbO_3$ (x=0 to 0.8). Alternatively, the mixture powder may preferably be $Li_x(K_{1-y}Na_y)_{1-x}(Nb_{1-z}Ta_z)O_3$ (wherein x=0.001 to 0.2, y=0 to 0.8, z=0 to 0.4), and the additive powder may also preferably be 0.001 to 5 mol % of Cu.

DETAILED DESCRIPTION OF THE PREFERRED EMBODIMENTS

Figure 1:
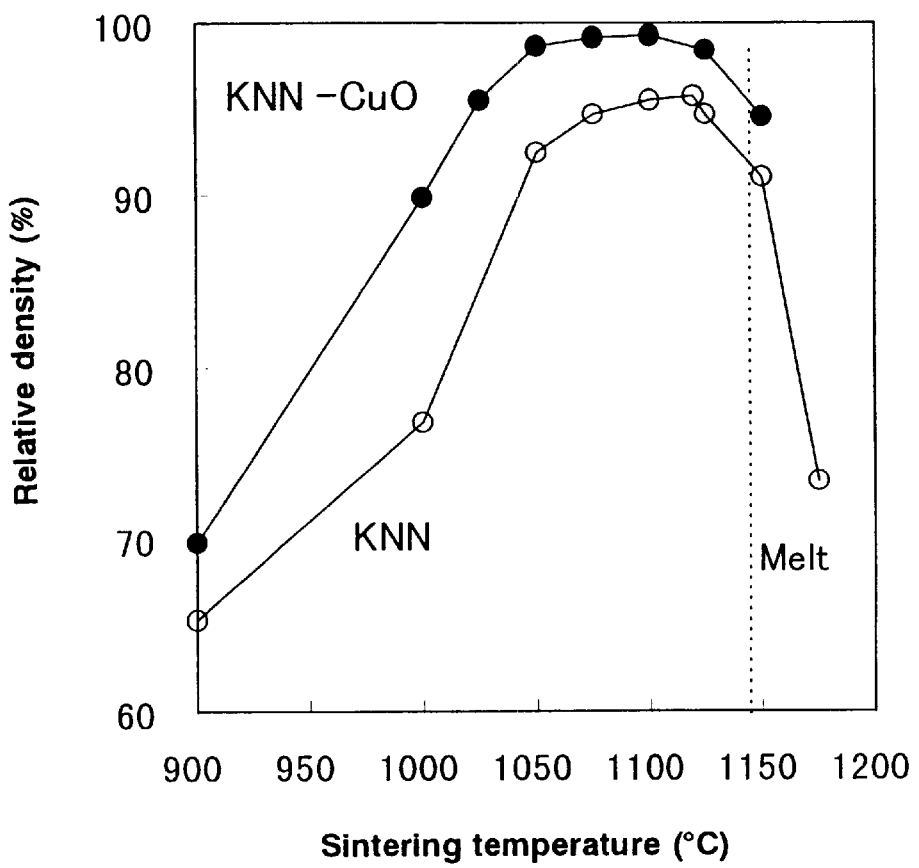
FIG. 1 shows a graph depicting the relation between sintering temperature and density in Example 1.

Examples of the present invention are described in detail with reference to drawings.

The process of producing sample is first described in accordance with the present invention. As the sintering method for use in the production, any of sintering at atmospheric pressure and sintering under pressure is satisfactory. As to the method for heating, all of the following heating methods are applicable: electric furnace heating; microwave heating; high frequency induction heating; infrared heating and the like. As to the state during sintering, sintering can satisfactorily be effected in oxygen flow and in air. In the present examples, therefore, the existing sintering method at atmospheric pressure for use in the production of ceramic material is adopted in oxygen flow (oxygen at 5% to 100%). Hereinbelow, the examples and the properties of the resulting produced samples are described on the basis of the measurement results of the samples.

EXAMPLE 1

A sample of the invention (Sample No. 1: KNN-CuO) was prepared by adding CuO to a base sample composed of the composition formula $K_{1-x}Na_xNbO_3$ (0≦x ≦0.8). The starting raw materials, namely $K_2CO_3$, $NaHCO_3$ and $Nb_2O_5$, individually at a purity of 99% or more and in powder, were blended together to a final composition formula of $K_{0.5}Na_{0.5}NbO_3$, to prepare a substance weighed in total of 50 g. By using acetone, then, the blend was mixed together with a ball mill for 20 hours; the mixture powder was dried and subsequently calcined at 900° C. for five hours; the resulting product was cracked and graded through a sieve of #60 mesh, to prepare a powder in a crystal phase of $K_{0.5}NaO_{0.5}NbO_3$.

To one mole of the crystal powder of $K_{0.5}Na_{0.5}NbO_3$ was added 0.01 mole of CuO, which was again mixed together with a ball mill by using acetone for 20 hours; the resulting mixture was ground into a powder of an average particle size of 0.3 to 0.4 micron, by using a sieve of #60 mesh. To the resulting ground powder was added 2 wt % of polyvinyl butyral; and the resulting mixture was dried and graded with a #60-mesh sieve, to prepare a pressed substance of a 18-mm diameter and a thickness of about 2 mm by using a single screw press of 2 ton/cm².

Then, the temperature of the pressed substance was elevated at a temperature elevation rate of 5° C./min in an oxygen flow of 0.3 l/min to 600° C. and was retained at the temperature for one hour; subsequently, the temperature of the pressed substance was heated at the same temperature elevation rate to 1050° C. and was then retained at the temperature for additional one hour. The temperature of the pressed substance was then cooled at 5° C./min to ambient temperature (about 25° C.), to prepare a sintered substance. Subsequently, the sintered substance was ground, polished and processed to a final thickness of 1 mm and a diameter of 15 mm; and an Au electrode was coated and deposited on the upper and lower faces of the disk-like sample by the sputtering method, followed by application of an electric field of 3 kV/mm in silicone oil at 100° C. for 10 minutes for poling treatment, to give piezoelectricity to the substance. After the sample thus prepared was left to stand for one hour, various properties thereof were measured.

At a stage when one hour passed after the poling of the sample No. 1 (KNN-CuO) thus prepared, the results of the measurement of the sample No.1 are shown in Table 1. The results of the measurement at a stage when 28 days passed after the poling of the sample are shown in Table 2. For comparative examination of these results of the measurement of the sample, the results of the measurement of a base sample (KNN) with no addition of CuO are simultaneously shown below.

TABLE 1

The results of the measurement of KNN-CuO
(one hour passed after the poling)

| Sample name | A Sample of the invention Sample No. 1 KNN-CuO | A Comparative Sample Base sample KNN | |
|---|---|---|---|
| A composition formula | $K_{0.5}Na_{0.5}NbO_3$ + 0.01 mole of CuO | $K_{0.5}Na_{0.5}NbO_3$ | |
| Measurement Item | | | |
| Relative density (%) | 98.8 | 96.2 | * |
| Piezoelectric properties | | | |
| Electromechanical coupling factors (kp) | 0.389 | 0.334 | * |
| Piezoelectric constant (d31 pm/V) | 29.2 | 37.6 | |
| Piezoelectric constant (d33 pm/V) | 96.2 | 115 | |
| Piezoelectric constant (g31 $10^{-3}$ Vm/N) | 13.92 | 9.90 | * |
| Piezoelectric constant (g33 $10^{-3}$ Vm/N) | 46.1 | 30.3 | * |
| Elastic properties | | | |
| Mechanical quality factor (Qm) | 1408.2 | 100.6 | * |
| Dielectric property | | | |
| Dielectric constant (E33t) | 237 | 429 | |
| Dielectric loss (tanδ) | 0.0045 | 0.0356 | * |
| Phase transition temperature | | | |
| Curie point (° C.) | 415 | 415 | |
| Temperature coefficient | | | |
| Dielectric constant (%/-50 to 100° C.) | 27 | 93 | * |
| Resistivity (Ω.cm) | 1.32E + 13 | 7.67E + 10 | * |

* Properties improved by CuO

TABLE 2

The results of the measurement of KNN-CuO
(28 days passed after the poling)

| Sample name | A Sample of the invention Sample No. 1 KNN-CuO | A Comparative Sample Base sample KNN | |
|---|---|---|---|
| A composition formula | $K_{0.5}Na_{0.5}NbO_3$ + 0.01 mole of CuO | $K_{0.5}Na_{0.5}NbO_3$ | |
| Measurement Item | | | |
| Relative density (%) | 98.6 | 96.2 | * |
| Piezoelectric properties | | | |
| Electromechanical coupling factors (kp) | 0.377 | 0.329 | * |
| Piezoelectric constant (d31 pm/V) | 27.8 | 38.6 | |
| Piezoelectric constant (d33 pm/V) | 96.7 | 115 | |
| Piezoelectric constant (g31 $10^{-3}$ Vm/N) | 13.59 | 9.30 | * |
| Piezoelectric constant (g33 $10^{-3}$ Vm/N) | 46.1 | 30.3 | * |
| Elastic properties | | | |
| Mechanical quality factor (Qm) | 1661.9 | 85.6 | * |
| Dielectric property | | | |
| Dielectric constant (E33t) | 231 | 470 | |
| Dielectric loss (tanδ) | 0.0045 | 0.0890 | * |
| Phase transition temperature | | | |
| Curie point (° C.) | 415 | 415 | |
| Temperature coefficient | | | |
| Dielectric constant (%/-50 to 100° C.) | 27 | 93 | * |
| Resistivity (Ω.cm) | 1.32E + 13 | 7.67E + 10 | * |

* Properties improved by CuO

In addition to relative density (%), the measurement items are electromechanical coupling factor (kp) during vibration along diameter direction, mechanical quality factor (Qm), electric voltage output piezoelectric factor (g31, g33), electric charge output piezoelectric factor (d31, d33), dielectric constant [∈33T/∈0 (in value at 1 kHZ)], and dielectric loss [tanδ (in value at 1 kHZ).

For the measurement and examination of the samples, use was made of the resonance/anti-resonance method according to EMAS-6007 was used. Herein, the Curie temperature (Curie point) representing the phase transition temperature from ferroelectric phase to paraelectric phase was determined on the basis of the temperature where the dielectric constant was the highest. Additionally, the stability over time when left to stand at ambient temperature was measured by using dielectric constant and dielectric loss at 1 kHz; the resistivity was determined on the basis of the values of electric current and electric voltage as measured 30 minutes after the application of electric voltage by the bi-terminal I-V method.

As shown in Table 1, the comparison of the results of the sample No. 1 (KNN-CuO) and the base sample (KNN) measured one hour after poling indicates that in the sample No. 1 as one inventive product, the relative density is increased and additionally, the electromechanical coupling factor (kp) and piezoelectric constant (g31, g33) as piezoelectric properties, and mechanical quality factor (Qm) as an elastic property are at far higher values. Furthermore, it is indicated that in the sample No. 1, the dielectric loss (tanδ) as a dielectric property is small, involving low values of the dielectric constant (%/−50 to 100° C.), and resistivity (Ω·cm) is large.

As shown in Table 2, the measured results of the sample No. 1 (KNN-CuO) and the base sample (KNN) 28 days after poling are greatly improved in the same manner as shown in Table 1. Additionally, because the improved measurement results do not show any significant variation even 28 days after poling, it is confirmed that CuO exerts its action on various properties and also an action on the stability over time.

FIG. 1 shows graphs depicting the relations between sintering temperature and density in the sample No. 1 (KNN-CuO) and the base sample (KNN). FIG. 1 shows that the sample No. 1 was highly densified over all the sintering temperatures and was at the highest density around a sintering temperature of about 1050° C. to about 1125° C. This is because a liquid phase emerges around 1050° C. to 1125° C. owing to the melting point of CuO at 1025° C.; the flow of the liquid then embeds (or replaces) the space among the solid-phase crystal particles, thereby highly densifying the crystal and involving the increase of the density. This indicates that CuO acts as a sintering auxiliary agent to highly densify the sample.

Figure 2:
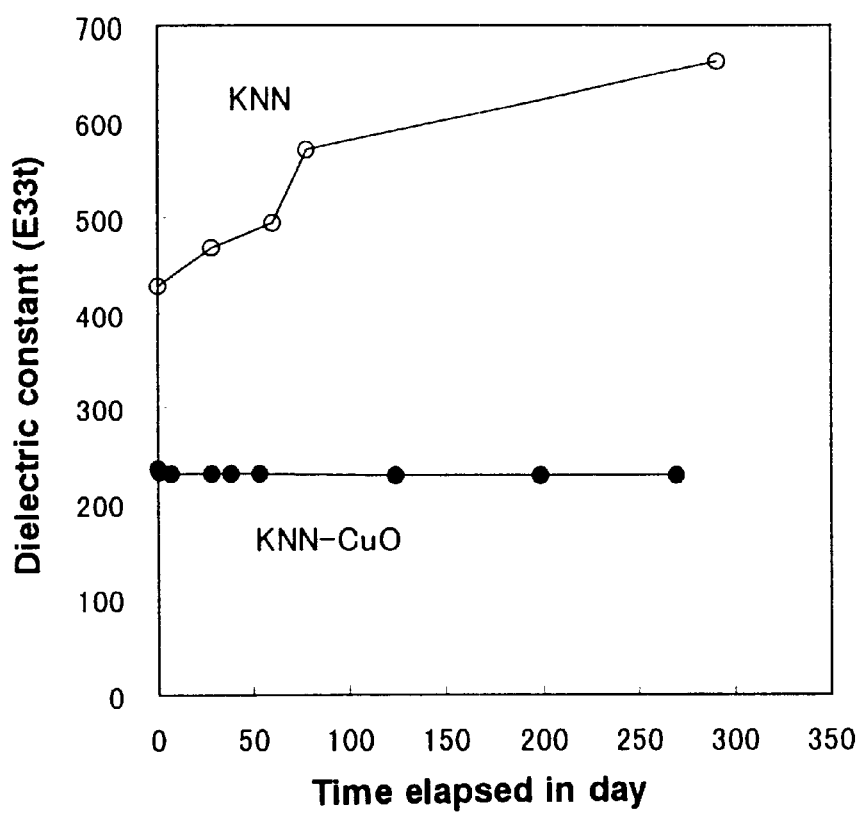
FIG. 2 shows a graph depicting the relation between dielectric constant and time elapsed in day in Example 1.
Figure 3:
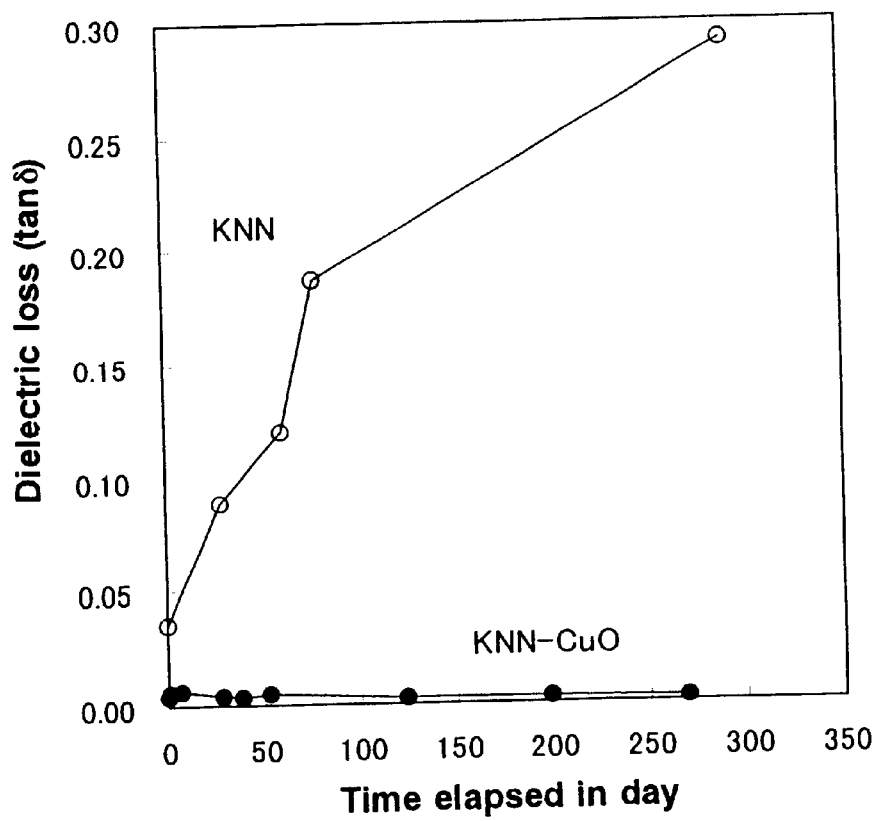
FIG. 3 shows a graph depicting the relation between dielectric loss and time elapsed in day in Example 1.
Figure 4:
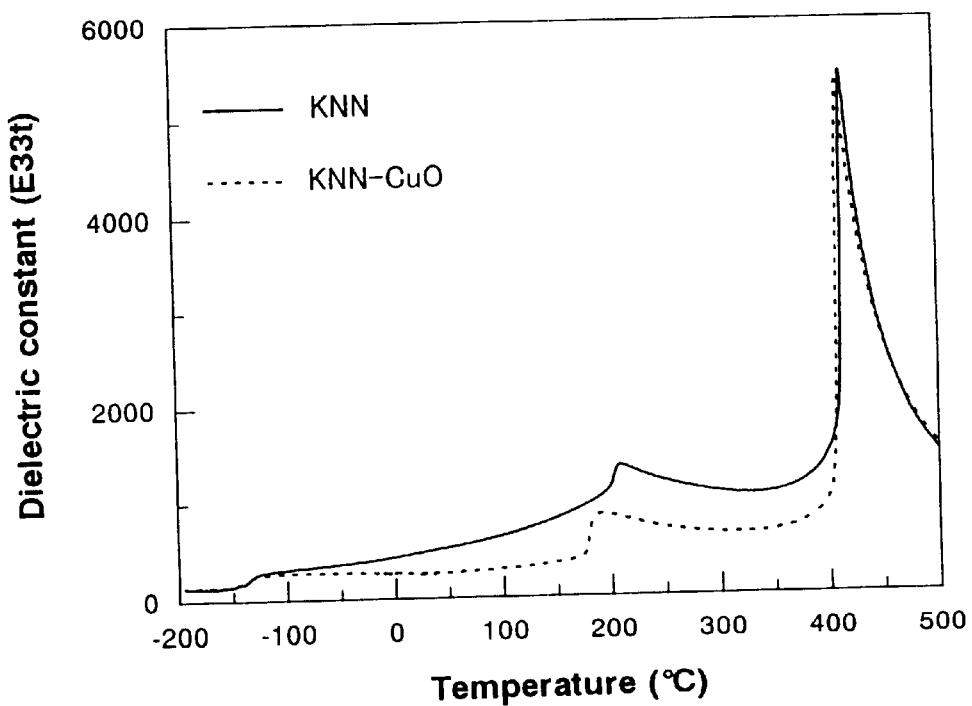
FIG. 4 shows a graph depicting the relation between dielectric constant and temperature in Example 1.
Figure 4:
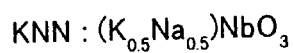
Figure 4:
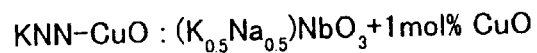

FIG. 2 shows graphs depicting the change of dielectric constant at a given temperature (ambient temperature of 25° C.) per a day interval over time. The graphs show that the dielectric constant of the sample No. 1 (KNN-CuO) was almost stable while the dielectric constant of the base sample (KNN) was gradually increased. As shown in FIG. 3, additionally, the dielectric loss of the sample No. 1 was likely to be stabilized, while the dielectric constant of the base sample was gradually increased over time. Furthermore, the sample No. 1 was at lower values of dielectric constant over the temperatures, as shown in FIG. 4.

This is because CuO was substitutionally solid solubilized in the crystal in the sample and exerted an action in such a way that CuO pinned and fixed the ferroelectric domain in the crystal. Generally, it is known that the movement of such domain causes the increase of the dielectric loss. Thus, the fixing of the domain stabilizes the dielectric loss and simultaneously improves the mechanical quality factor (Qm). Additionally because the dielectric constant is reduced with no change of piezoelectric constant d, the piezoelectric constant g can be improved greatly. It is verified from this that a material with great sinterability and good stability over time can be prepared by the existing sintering method at atmospheric pressure.

Although not shown in these figures, the amount of CuO added within a range of 0.001 mol % to 5.0 mol % improves the piezoelectric constant g and simultaneously improves the stability over time. Within a range of 0.1 mol % to 2.0 mol %, in particular, CuO acts as a sintering auxiliary agent. Less than the amount thereof to be added, CuO does not work as a sintering auxiliary agent; more than the amount thereof to be added, the resulting piezoelectric properties are poor. Thus, the amount of copper oxide to be added is considered as appropriate at about 1 mol %

A sample (sample No. 2) prepared by adding Li and Ta to a base sample composed of a composition formula $K_{1-x}Na_xNbO_3$ ($0 \leq x \leq 0.8$) is described below.

EXAMPLE 2

For a sample (sample No. 2; KNN-LT) to be used in Example 2, use was made of $LiCO_3$, $K_2CO_3$, $NaHCO_3$, $Nb_2O_5$, and $Ta2O5$, individually at a purity of 99% or more. These individual powders were blended together to a final composition formula of $(Li_{0.1}K_{0.45}Na_{0.45})$ $(Nb, Ta)O_3$, to weigh a composition of a total weight of 50 g. At the same production process as shown in Example 1, the sample No.2 was prepared. The production process is already described in Example 1. Accordingly, the description of the production process is omitted herein.

Subsequently, the sample No. 2 (KNN-LT) was measured at a stage when one hour passed after poling. The results are shown in Table 3. Table 4 shows the results of the measurement at a stage when 28 days passed after poling. Simultaneously, the measurement results of a base sample (KNN) with no addition of Li and Ta are individually shown additionally. For the measurement and examination of the samples, the resonance/anti-resonance method was used in the same manner as in Example 1. The Curie temperature was determined as the temperature at the highest dielectric constant.

TABLE 3

The results of the measurement of KNN-LT (one hour passed after the poling)

| Sample name | A Sample of the invention Sample No. 2 KNN-LT | A Comparative Sample Base sample KNN | |
|---|---|---|---|
| A composition formula | $\{(K_{0.5}Na_{0.5})_{0.9}Li_{0.1}\}$ $(Na_{0.8}Ta_{0.2})O_3$ | $K_{0.5}Na_{0.5}NbO_3$ | |
| Measurement Item | | | |
| Relative density (%) | 99.0 | 96.2 | |
| Piezoelectric properties | | | |
| Electromechanical coupling factors (kp) | 0.307 | 0.334 | |
| Piezoelectric constant (d31 pm/V) | 36.3 | 37.6 | |
| Piezoelectric constant (d33 pm/V) | 104 | 115 | |
| Piezoelectric constant (g31 $10^{-3}$ Vm/N) | 6.57 | 9.90 | |
| Piezoelectric constant (g33 $10^{-3}$ Vm/N) | 11.9 | 30.3 | |
| Elastic properties | | | |
| Mechanical quality factor (Qm) | 273.4 | 100.6 | * |
| Dielectric property | | | |
| Dielectric constant (E33t) | 624 | 429 | |
| Dielectric loss (tanδ) | 0.0071 | 0.0356 | * |
| Phase transition temperature | | | |
| Curie point (° C.) | 380 | 415 | |
| Phase transition temperature (Ortho→Tetra) | NONE | 210 | * |
| Temperature coefficient | | | |
| Dielectric constant (%/−50 to 100° C.) | 10 | 93 | * |
| Resistivity (Ω.cm) | 3.15E + 10 | 7.67E + 10 | |

* Properties improved by Li, Ta

TABLE 4

The results of the measurement of KNN-LT
(28 days passed after the poling)

| Sample name | A Sample of the invention Sample No. 2 KNN-LT | A Comparative Sample Base sample KNN | |
|---|---|---|---|
| A composition formula | $\{(K_{0.5}Na_{0.5})_{0.9}Li_{0.1}\}(Na_{0.8}Ta_{0.2})O_3$ | $K_{0.5}Na_{0.5}NbO_3$ | |
| Measurement Item | | | |
| Relative density (%) | 99.0 | 96.2 | |
| Piezoelectric properties | | | |
| Electromechanical coupling factors (kp) | 0.290 | 0.329 | |
| Piezoelectric constant (d31 pm/V) | 33.4 | 38.6 | |
| Piezoelectric constant (d33 pm/V) | 104 | 115 | |
| Piezoelectric constant (g31 $10^{-3}$ Vm/N) | 6.23 | 9.30 | |
| Piezoelectric constant (g33 $10^{-3}$ Vm/N) | 11.6 | 30.3 | |
| Elastic properties | | | |
| Mechanical quality factor (Qm) | 360.1 | 85.6 | * |
| Dielectric property | | | |
| Dielectric constant (E33t) | 606 | 470 | |
| Dielectric loss (tanδ) | 0.0070 | 0.0890 | * |
| Phase transition temperature | | | |
| Curie point (° C.) | 380 | 415 | |
| Phase transition temperature (Ortho→Tetra) | NONE | 210 | * |
| Temperature coefficient | | | |
| Dielectric constant (%/−50 to 100° C.) | 10 | 93 | * |
| Resistivity (Ω.cm) | 3.15E + 10 | 7.67E + 10 | |

* Properties improved by Li, Ta

As shown in Table 3, the comparison of the measured results of the sample No. 2 (KNN-LT) and the base sample (KNN) one hour after poling indicates an improvement in the stability of dielectric constant(%/−50 to 100° C.) over temperature as well as large mechanical quality factor (Qm) including small dielectric loss (tanδ). As shown in Table 4, furthermore, the measured results 28 days after poling are not markedly different from the measured results shown in Table 3. Thus, it is verified that Li and Ta act on the temperature properties and also act on the stability over time.

Figure 5:
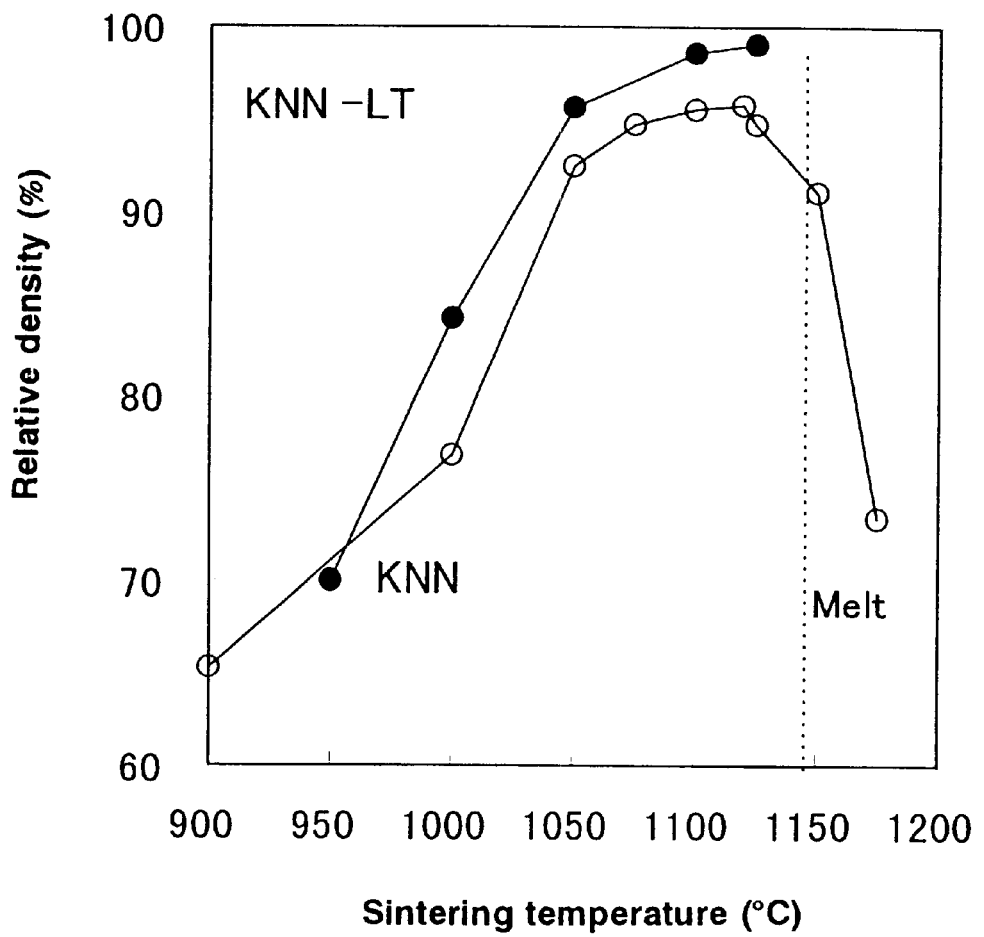
FIG. 5 shows a graph depicting the relation between density and sintering temperature in Example 2.

FIG. 5 shows graphs depicting the relation between density and sintering temperature in the sample No. 2 (KNN-LT) and the base sample (KNN). The figure indicates that the sample No. 2 is highly densified. This is due to the fact that while materials are generally sintered by solid-phase sintering, the component and phase of added Li oxide are liquefied as the sintering temperature is raised, so that a state emerges where the liquefied component is concurrently present with solidified components and phases of other materials with no occurrence of liquefaction, which is then subjected to sintering (liquid-phase sintering). In such a manner, the high densification of material can be accomplished.

Figure 6:
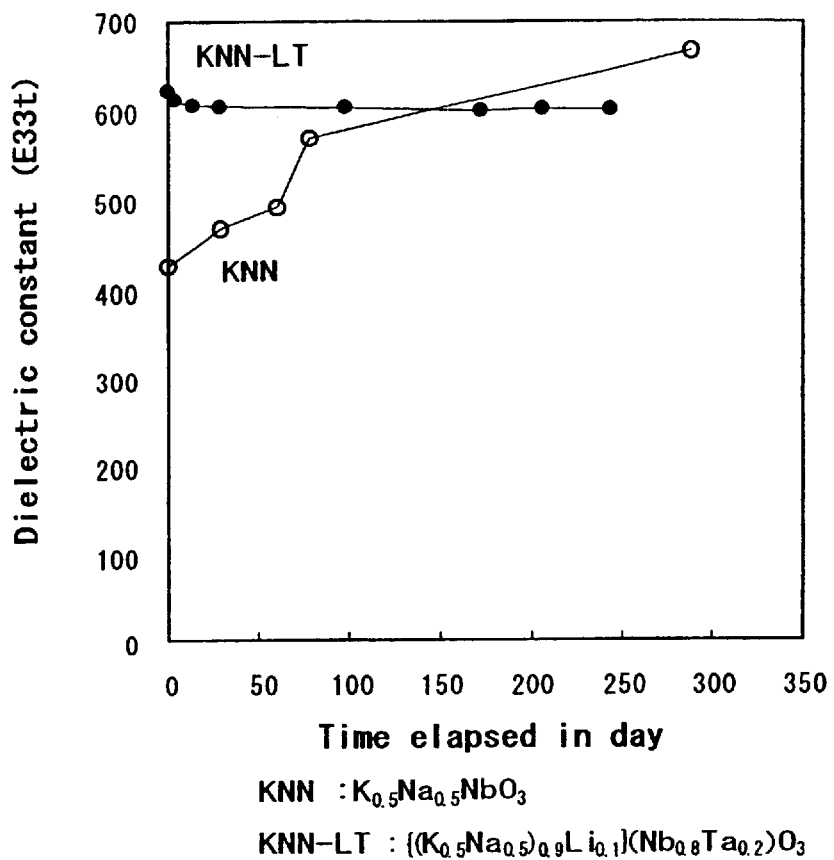
FIG. 6 shows a graph depicting the relation between dielectric constant and time elapsed in day in Example 2.
Figure 7:
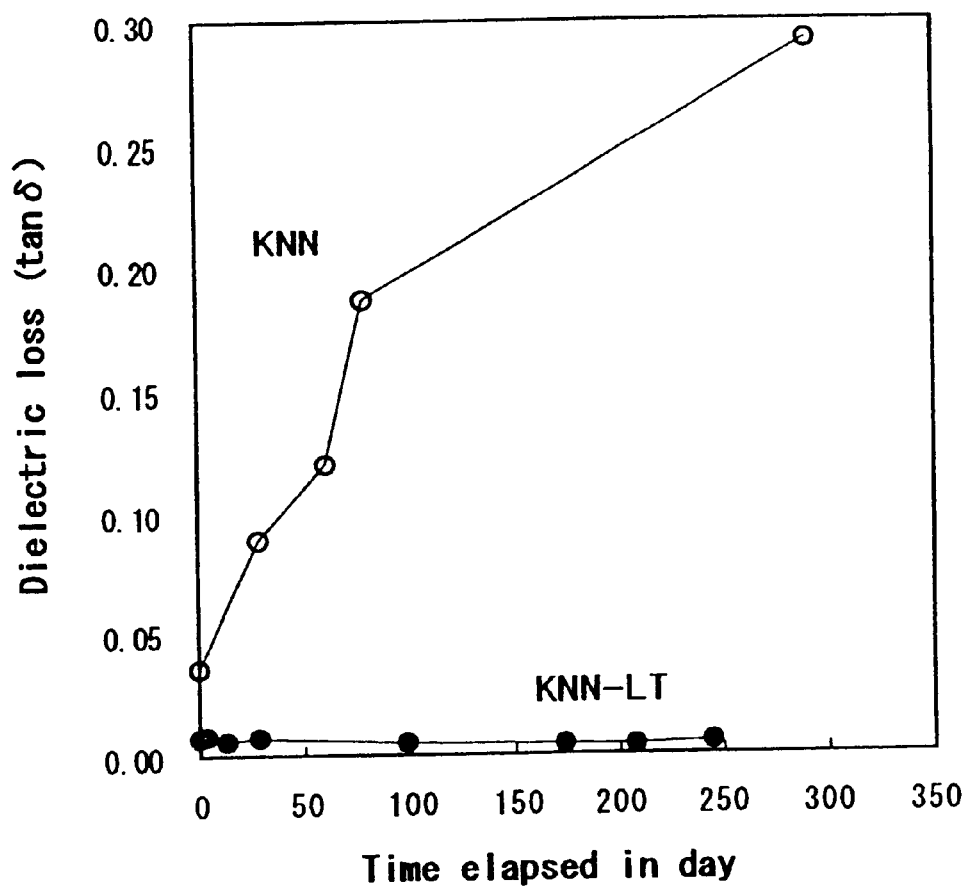
FIG. 7 shows a graph depicting the relation between dielectric loss and time elapsed in day in Example 2.

FIG. 6 shows graphs depicting the relation between dielectric constant and time elapsed in day at a given temperature (ambient temperature of 25° C.). As shown in the figure, the dielectric constant of the sample No. 2 is rather higher at an almost stable value even after days pass. It is confirmed that the stability of the sample No. 2 over time is good. FIG. 7 additionally shows graphs depicting the relation between dielectric loss and time elapsed in day at a given temperature (ambient temperature of 25° C.). The graphs show that the sample No. 2 (KNN-LT) retains a stable value despite the time elapsed in day. This is ascribed to the role of Ta such that Ta pins and fixes the ferroelectric domain in the crystal. As described above, the movement of the domain is caused by the increase of the dielectric loss. Thus, the dielectric loss can be reduced at a stable value due to the fixing of the ferroelectric domain.

Figure 8:
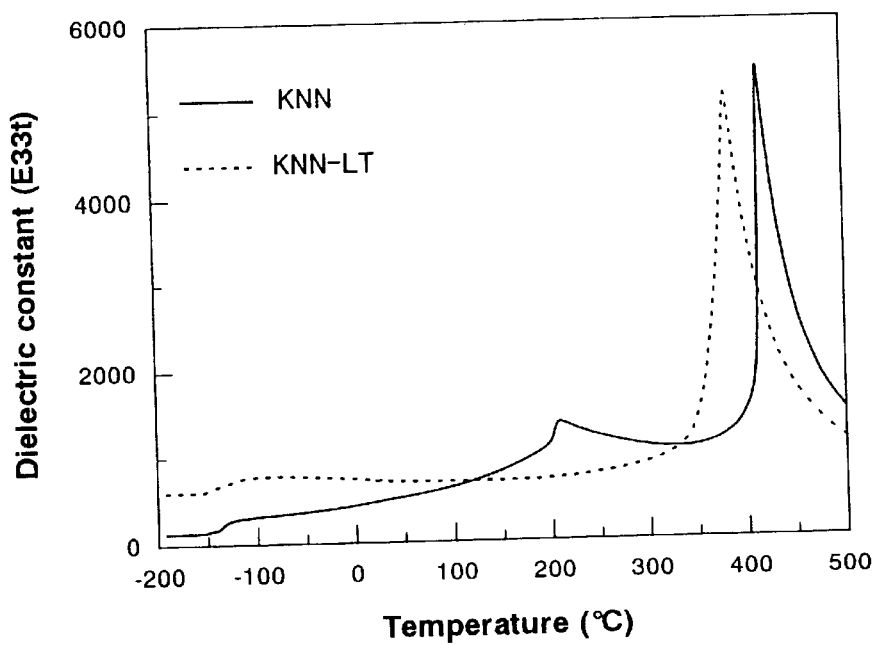
FIG. 8 shows a graph depicting the relation between dielectric constant and temperature in Example 2.

FIG. 8 shows graphs depicting the relations between dielectric constant and temperature in the sample No. 2 (KNN-LT) and the base sample (KNN). As shown in the figure, it is confirmed that no intermediate transfer phase transition (around 210° C.) is present in the sample No. 2 and that an almost stable dielectric constant can be recovered. This is ascribed to the fact that the crystal phase changes from orthorhombic crystal to tetragonal crystal at room temperature due to the addition of Li at 10 mol %. It is considered that the intermediate phase transition is thus lost, whereby the temperature properties are stabilized.

As not shown in the figure, the Li to be added at an amount within a range of 0.1 mol % to 20 mol % acts as a sintering auxiliary agent to highly densify the material; above 20 mol %, $LiNbO_3$ is generated so that a mixture phase emerges, which deteriorates the piezoelectric properties.

Figure 9A:
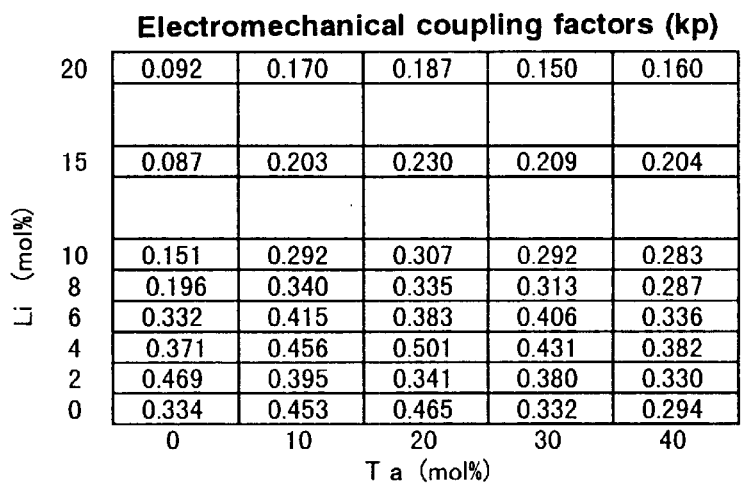
FIGS. 9(a), 9(b) and 9(c) show graphs depicting the changes of piezoelectric properties at various amounts of Ta and Li in the compositions of $Li_x(K_{0.5}Na_{0.5})_{1-x}(Nb_{1-y}Ta_y)O_3$ (wherein x=0 to 0.20, y=0 to 0.40)
Figure 9B:
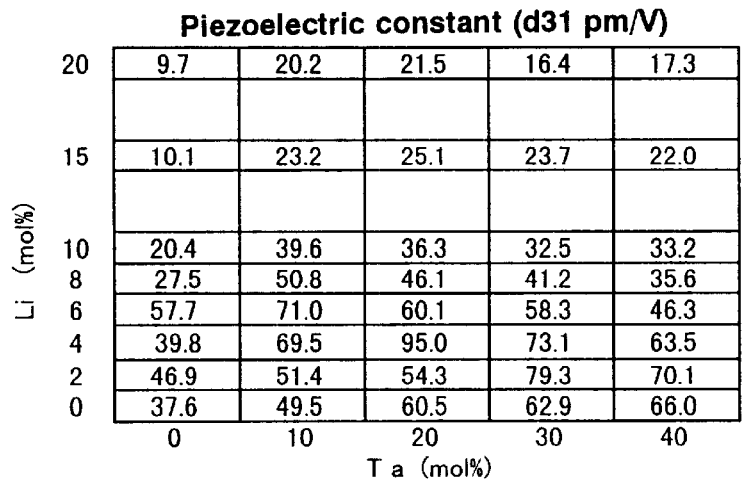
Figure 9C:
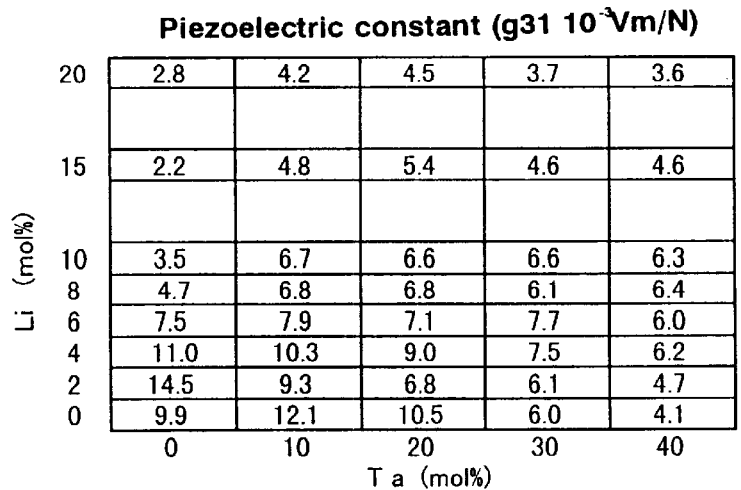
Figure 10A:
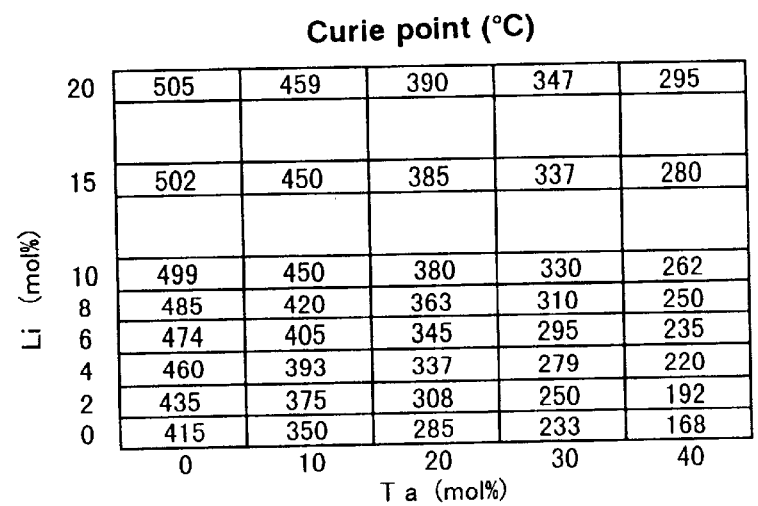
FIGS. 10(a), 10(b) and 10(c) show graphs depicting curie temperature, dielectric constant and dielectric loss at various amounts of Ta and Li as shown in FIG. 9.
Figure 10B:
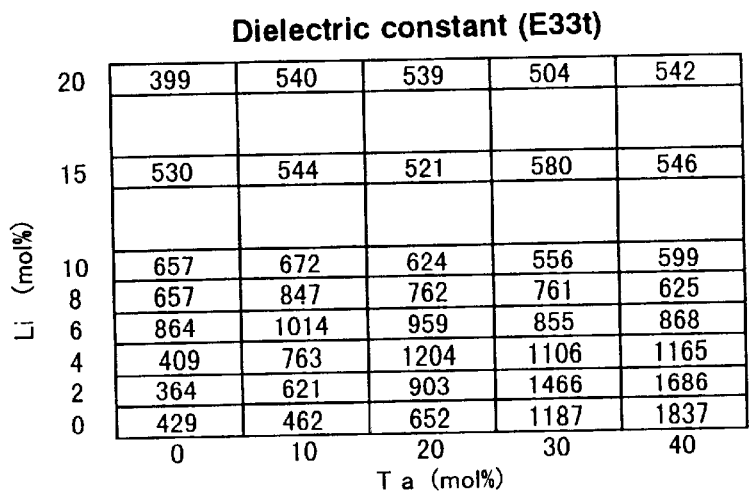
Figure 10C:
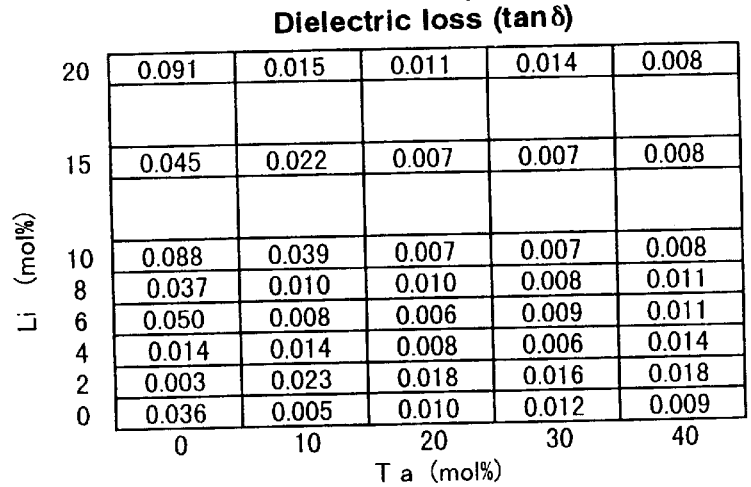

FIGS. 9 and 10 show graphs depicting the piezoelectric properties at the compositions of $Li_x(K_{0.5}Na_{0.5})_{1-x}(Nb_{1-z}T_z)O_3$, wherein x=0.002, 0.06, 0.08, 0.10,0.15,0.20; z=0, 0.10, 0.20, 0.30, 0.40, [FIG. 9(a), electromechanical coupling factor; FIG. 9(b), piezoelectric constant (d31); FIG. 9c, piezoelectric constant (g31)] and dielectric properties [FIG. 10(a), Curie temperature; FIG. 10(b), dielectric constant; FIG. 10(c), dielectric loss]. It is confirmed that the electric coupling factors are at larger values above 10 mol % of Ta (wherein 0 to 6 mol % of Li) added in an amount than the base sample (KNN), as shown in FIG. 10(a); the piezoelectric constant (d31) shown in FIG. 9(b) is at the highest value at about 20 mol % of Ta (at 4 mol % of Li) added in amount; additionally, the piezoelectric constant (g31) shown in FIG. 9(c) are larger values at 120 mol % and 20 mol % of Ta (at 0 mol % of Li) than the base sample (KNN).

As shown in FIG. 10(a), furthermore, it is confirmed that the curie temperature is the highest at 0 mol % of Ta (at 20 mol % of Li) added in amount; and then, the increase of the amount of Ta added involves a tendency of the decrease; as shown in FIG. 10(b), further, the dielectric constant gradually decreases as the amount of Ta added increases at 10 mol % of Li; the dielectric loss shown in FIG. 10(c) is at the highest value, at 0 mol % of Ta (at 20 mol % of Li) added in amount, while the dielectric loss is at almost stable and low values, at 10 mol % to 40 mol % of Ta added in amount.

In such a fashion, the results of the measurement at 0 mol % to 40 mol % of Ta added in amount are shown; it is herein confirmed that above 40 mol % of Ta added in amount, the curie temperature is below 300° C., which indicates that the temperature properties are deteriorated. These results suggest that as to the amount of Ta added, about 20 mol % (at 10 mol % of Li) acts most highly on the temperature stability.

The present invention is never limited to the aforementioned examples. Various modifications are possible within the scope of the present invention. For example, a material composed of a composition formula $(K_xNa_x)NbO_3$ is used as an alkali metal-based material in the above examples, but other materials can be used and additives therefor can be modified. In such a manner, a material with good sinterability and stability over time, and high temperature stability, can be produced.

The foregoing description of the preferred embodiments of the invention has been presented for purposes of illustration and description. It is not intended to be exhaustive or to limit the invention to the precise form disclosed, and modifications and variations are possible in the light of the above teachings or may be acquired from practice of the invention. The embodiments chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An alkali-metal containing niobate-based piezoelectric sintering material composition comprising a solid solution represented by a composition formula $Li_x(K_{1-y}Na_y)_{1-x}(Nb_{1-z}Ta_z)O_3$, wherein x=0.001 to 0.2, y=0 to 0.8, z=0 to 0.4, and at least one additive selected from the group consisting of Cu, Li and Ta.

2. The alkali metal-containing niobate-based piezoelectric sintering material composition according to claim 1, wherein said at least one additive is Cu, Li and Ta, each of them present in an amount of not more than 5 mol %.

3. The alkali metal-containing niobate-based piezoelectric sintering material composition according to claim 1, wherein said at least one additive is Cu, Li and Ta, the Cu being present in an amount of 0.001 to 5 mol %.

4. An alkali metal-containing niobate-based piezoelectric sintering material composition comprising a solid solution represented by a composition formula $K_{1-x}Na_xNbO_3$, wherein x=0 to 0.8, and Cu as an additive present in an amount of 0.001 to 5 mol %.

5. The alkali metal-containing niobate-based piezoelectric material composition according to claim 4, wherein the amount of Cu is 1 mol % or less.

6. A method for producing an alkali metal-containing niobate-based piezoelectric sintering material composition, comprising:

adding an additive powder containing at least one element selected from the group consisting of Cu, Li and Ta to a powder of niobate represented by formula $ANbO_3$, wherein A is an alkali metal, then blending these powders together;

molding said blended powders and sintering the same, and treating the resulting sintered substance to impart piezoelectricity thereto, wherein said additive powder is 0.001 to 5 mol % of Cu, and the blended powder of a niobate is $K_{1-x}Na_xNbO_3$, wherein x=0 to 0.8.

7. A method for producing an alkali metal-containing niobate-based piezoelectric sintering material composition, comprising:

adding an additive powder containing at least one element selected from the group consisting of Cu, Li and Ta to a powder of niobate represented by formula $ANbO_3$, wherein A is an alkali metal, then blending these powders together;

molding said blended powders and sintering the same, and treating the resulting sintered substance to impart piezoelectricity thereto, wherein the blended powder of a niobate is $Li_x(K_{1-y}Na_y)_{1-x}(Nb_{1-z}Ta_z)O_3$, wherein x=0.001 to 0.2, y=0 to 0.8, z=0 to 0.4.

8. The method according to claim 7, wherein said additive powder is 0.001 to 5 mol % of Cu.

9. A method for producing an alkali metal-containing niobate-based piezoelectric sintering material composition, comprising:

adding an additive powder containing at least one element selected from the group consisting of Cu, Li, and Ta to a mixture of a powder of precursor compounds for a niobate, then blending these powders together;

molding said blended powders and sintering the same; and treating the resulting sintered substance to impart piezoelectricity thereto, wherein said blended powder of niobate is $Li_x(K_{1-y}Na_y)_{1-x}(Nb_{1-z}Ta_z)O_3$, wherein x=0.001 to 0.2, y 0 to 0.8, z=0 to 0.4.

* * * * *

UNITED STATES PATENT AND TRADEMARK OFFICE
CERTIFICATE OF CORRECTION

PATENT NO. : 6,387,295 B1
DATED : May 14, 2002
INVENTOR(S) : Saito

It is certified that error appears in the above-identified patent and that said Letters Patent is hereby corrected as shown below:

<u>Title page,</u>
Item [75], the Inventor information is incorrect. Item [75] should read:

-- [75]  Inventor:    Yasuyoshi Saito, Aichi-gun (JP) --

Item [56], References Cited, information is incorrect. Item [56] should read:

-- [56]            References Cited

U.S. PATENT DOCUMENTS

| | | | |
|---|---|---|---|
| 5,476,720 | A | * 12/1995 | Günter et al. ......... 428/471 |
| 5,562,768 | A | 10/1996 | Ouwerkerk ............ 117/78 |
| 5,614,129 | A | * 3/1997 | Hofmeiser et al. ..... 252/584 |

FOREIGN PATENT DOCUMENTS

| | | |
|---|---|---|
| JP | 50-47193 | 4/1975 |
| JP | 60-52098 | 11/1985 |
| JP | 1-032186 | 6/1989 |
| JP | 3-40000 | 6/1991 |
| JP | 7-82024 | 3/1995 |
| JP | 9-165262 | 6/1997 |

UNITED STATES PATENT AND TRADEMARK OFFICE
CERTIFICATE OF CORRECTION

PATENT NO. : 6,387,295 B1
DATED : May 14, 2002
INVENTOR(S) : Saito

It is certified that error appears in the above-identified patent and that said Letters Patent is hereby corrected as shown below:

OTHER PUBLICATIONS

Patent Abstracts of Japan, vol. 004, No. 087 (E-016), Jun. 21, 1980, JP 55 055589, Apr. 23, 1980.

R.M. Henson, et al., Journal of the American Ceramic Society, vol. 60, No. 1-2, pp. 15 to 17, "Dielectric and Electromechanical Properties of (Li, Na) $NbO_3$ Ceramics", Jan. 1997.

R. Hofmeister et al., Journal of Crystal Growth, vol. 131, No. 3-4, pp. 486-494, "Growth and Characterization of the Perovskite, $K_{1-y}Li_y^{Ta}{}_{1-x}Nb_xO_3$: Cu", Aug. 1993.

Abstract for JP 55-55589, Apr. 23, 1980.*

Hanson et al., "Dielectric and Electromechanical Properties of (Li,Na)NbO3 Ceramics", Journ. Amer, Cer. Soc., vol. 60, No. 1-2, Jan. 1997, pp. 15-17.*

Hofmeister et al., "Groath and Characterization of The Perovskite K(1-y)LiYTa(1-x)NbxO3:Cu", Journ. Crystl. Growth, vol. 131, No. 3-4, 8/93, pp. 486-894.*

* cited by examiner --

Signed and Sealed this

Seventeenth Day of December, 2002

JAMES E. ROGAN
*Director of the United States Patent and Trademark Office*

(12) EX PARTE REEXAMINATION CERTIFICATE (9783rd)
United States Patent
Saito

(10) Number: US 6,387,295 C1
(45) Certificate Issued: Aug. 1, 2013

(54) ALKALI METAL-CONTAINING NIOBATE-BASED PIEZOELECTRIC MATERIAL COMPOSITION AND A METHOD FOR PRODUCING THE SAME

(75) Inventor: Yasuyoshi Saito, Aichi-ken (JP)

(73) Assignee: Kabushiki Kaisha Toyota Chuo Kenkyusho, Aza Yokomichi Oaza Nagakute, Nagakute-cho, Aichi-gun, Aichi-ken (JP)

Reexamination Request:
No. 90/012,255, May 8, 2012

Reexamination Certificate for:
Patent No.: 6,387,295
Issued: May 14, 2002
Appl. No.: 09/511,316
Filed: Feb. 23, 2000

Certificate of Correction issued Dec. 17, 2002

(30) Foreign Application Priority Data

Feb. 24, 1999 (JP) .................................... 11-045856
Feb. 21, 2000 (JP) ................................ 2000-042095

(51) Int. Cl.
*H01L 41/18* (2006.01)
*H01L 41/187* (2006.01)

(52) U.S. Cl.
USPC ........ 252/62.9 R; 264/614; 264/431; 264/432; 264/436; 264/442; 264/489; 264/491; 264/492; 501/134

(58) Field of Classification Search
None
See application file for complete search history.

(56) References Cited

To view the complete listing of prior art documents cited during the proceeding for Reexamination Control Number 90/012,255, please refer to the USPTO's public Patent Application Information Retrieval (PAIR) system under the Display References tab.

*Primary Examiner* — Sean E Vincent

(57) ABSTRACT

An alkali metal-containing niobate-based piezoelectric material composition comprises a solid solution represented by a composition formula $(ANbO_3)$ (A: alkali metal), and at least one additive selected from Cu, Li and Ta.

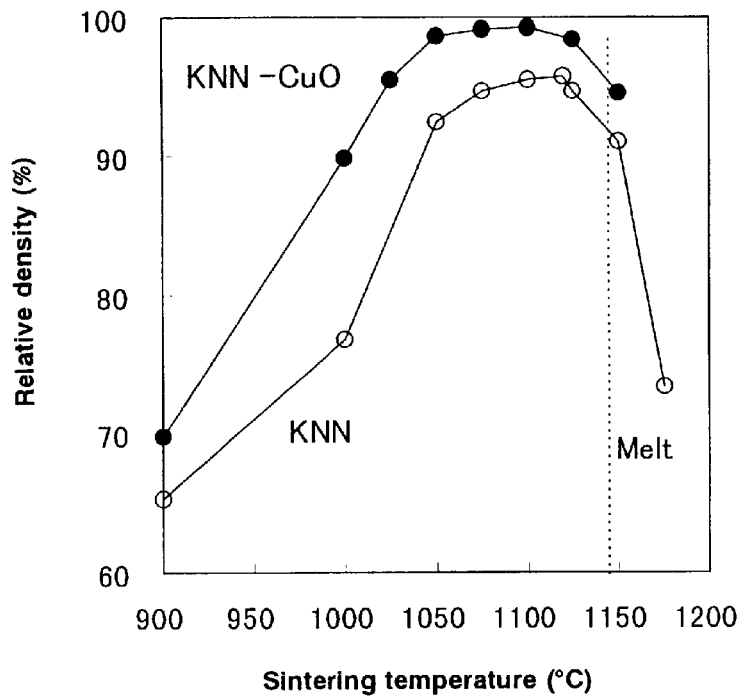

KNN : $K_{0.5}Na_{0.5}NbO_3$

KNN –CuO: $K_{0.5}Na_{0.5}NbO_3$

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 3-5 is confirmed.

Claims 1, 2 and 9 are cancelled.

Claims 6-8 were not reexamined.

* * * * *